US012384624B2

(12) United States Patent
Yoshimizu et al.

(10) Patent No.: US 12,384,624 B2
(45) Date of Patent: Aug. 12, 2025

(54) STORAGE DEVICE AND CONTROL METHOD

(71) Applicant: Kioxia Corporation, Tokyo (JP)

(72) Inventors: Yasuhito Yoshimizu, Mie (JP); Takashi Fukushima, Mie (JP); Tatsuro Hitomi, Kanagawa (JP); Arata Inoue, Kanagawa (JP); Masayuki Miura, Mie (JP); Shinichi Kanno, Tokyo (JP); Toshio Fujisawa, Kanagawa (JP); Keisuke Nakatsuka, Hyogo (JP); Tomoya Sanuki, Mie (JP)

(73) Assignee: Kioxia Corporation, Tokyo (JP)

( * ) Notice: Subject to any disclaimer, the term of this patent is extended or adjusted under 35 U.S.C. 154(b) by 822 days.

(21) Appl. No.: 17/694,532

(22) Filed: Mar. 14, 2022

(65) Prior Publication Data

US 2022/0204270 A1 Jun. 30, 2022

Related U.S. Application Data

(63) Continuation of application No. PCT/JP2019/044931, filed on Nov. 15, 2019.

(51) Int. Cl.
*B65G 1/137* (2006.01)
(52) U.S. Cl.
CPC ................. *B65G 1/1373* (2013.01)
(58) Field of Classification Search
CPC .................................................. B65G 1/1373
See application file for complete search history.

(56) References Cited

U.S. PATENT DOCUMENTS

| 4,489,397 | A | | 12/1984 | Lee | |
|---|---|---|---|---|---|
| 5,217,501 | A | * | 6/1993 | Fuse | H01L 21/67757 |
| | | | | | 29/25.01 |
| 5,217,834 | A | * | 6/1993 | Higaki | G03F 7/70616 |
| | | | | | 430/311 |
| 6,063,640 | A | | 5/2000 | Mizukoshi et al. | |
| 6,445,203 | B1 | * | 9/2002 | Yamashita | G01R 31/2874 |
| | | | | | 324/750.08 |
| 6,499,121 | B1 | | 12/2002 | Roy et al. | |
| 9,159,451 | B2 | | 10/2015 | Chen | |
| 10,332,860 | B2 | | 6/2019 | Fricker et al. | |
| 11,062,886 | B2 | * | 7/2021 | Peng | H01L 21/67248 |

(Continued)

FOREIGN PATENT DOCUMENTS

| CN | 101344570 A | 1/2009 |
|---|---|---|
| JP | H09298225 A | 11/1997 |

(Continued)

*Primary Examiner* — Kyle O Logan
(74) *Attorney, Agent, or Firm* — Maier & Maier, PLLC

(57) ABSTRACT

According to one embodiment, a storage device includes a control apparatus and a stocker. The control apparatus writes data to or reads data from a storage medium that includes a plurality of non-volatile memory chips. The stocker stores a plurality of the storage media that are detached from the control apparatus. The control apparatus includes a first temperature control system. The first temperature control system raises temperature of the storage medium to a first temperature or higher. The stocker includes a second temperature control system. The second temperature control system cools the storage medium to a second temperature or lower. The second temperature is lower than the first temperature.

20 Claims, 12 Drawing Sheets

(56) References Cited

U.S. PATENT DOCUMENTS

| | | |
|---|---|---|
| 2004/0222809 A1 | 11/2004 | Leedy |
| 2005/0225346 A1* | 10/2005 | Saito ................ G01R 31/2877 324/757.01 |
| 2012/0091211 A1 | 4/2012 | Kuroda |
| 2013/0056101 A1 | 3/2013 | Baussie et al. |
| 2013/0250709 A1 | 9/2013 | Chen |
| 2015/0370245 A1* | 12/2015 | Sugishita ................ C23C 16/52 700/121 |
| 2018/0321279 A1 | 11/2018 | Hsu |
| 2019/0041454 A1 | 2/2019 | Akiyama et al. |
| 2019/0096713 A1 | 3/2019 | Chen et al. |
| 2019/0164730 A1 | 5/2019 | Peng et al. |
| 2020/0176280 A1* | 6/2020 | Kuwahara ........... H01L 21/6732 |
| 2020/0379037 A1* | 12/2020 | Endo .................. G01R 31/2865 |
| 2022/0206058 A1* | 6/2022 | Motomura ........ H01L 21/67724 |

FOREIGN PATENT DOCUMENTS

| | | |
|---|---|---|
| JP | 2005-228788 A | 8/2005 |
| JP | 2007-96190 A | 4/2007 |
| JP | 2010-287113 A | 12/2010 |
| JP | 2013221911 A | 10/2013 |
| JP | 5611597 B2 | 10/2014 |
| KR | 10-2006-0127662 A | 12/2006 |
| TW | 201926504 A | 7/2019 |
| WO | 2008/070811 A2 | 6/2008 |

\* cited by examiner

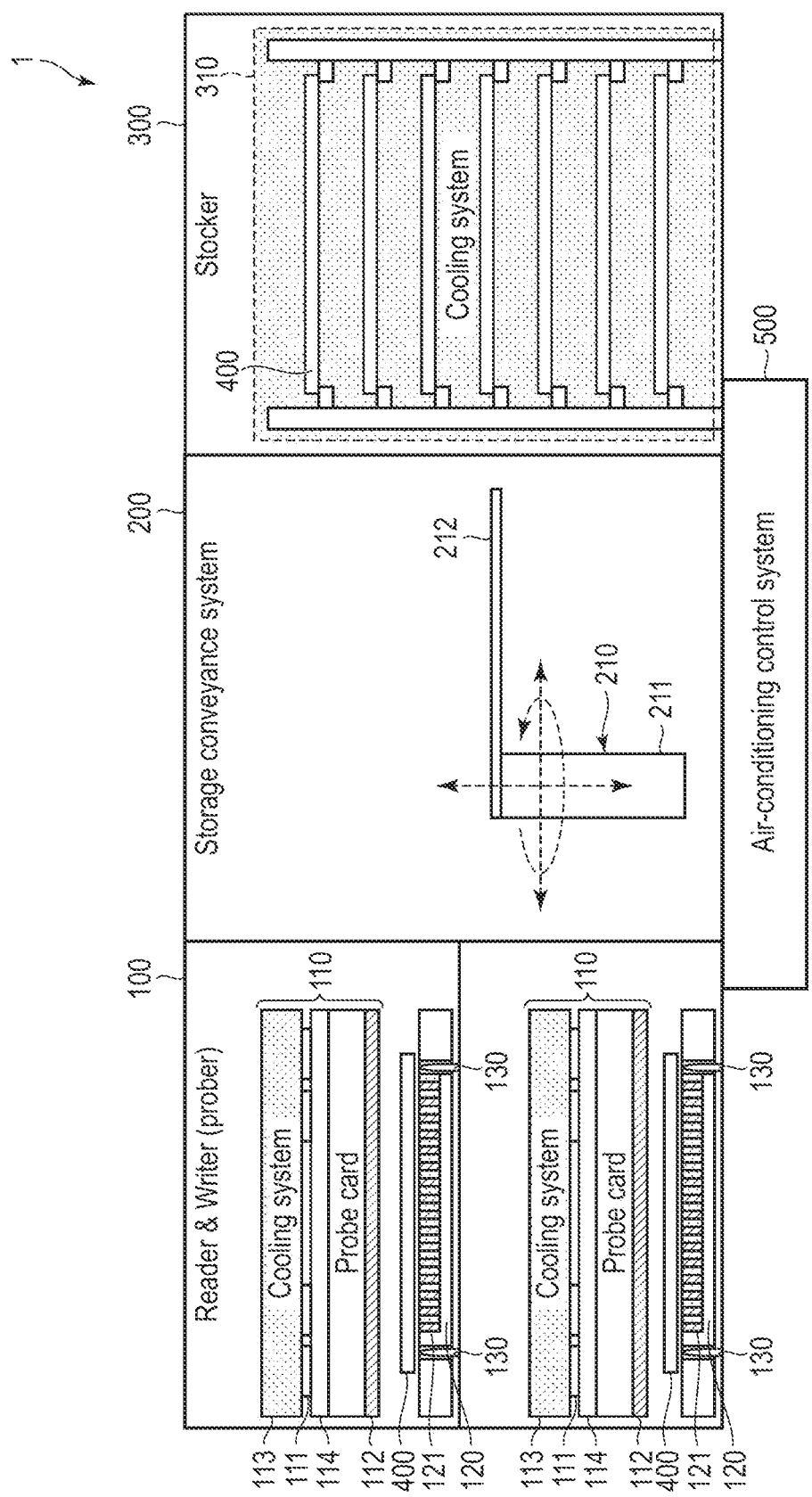
F I G. 1

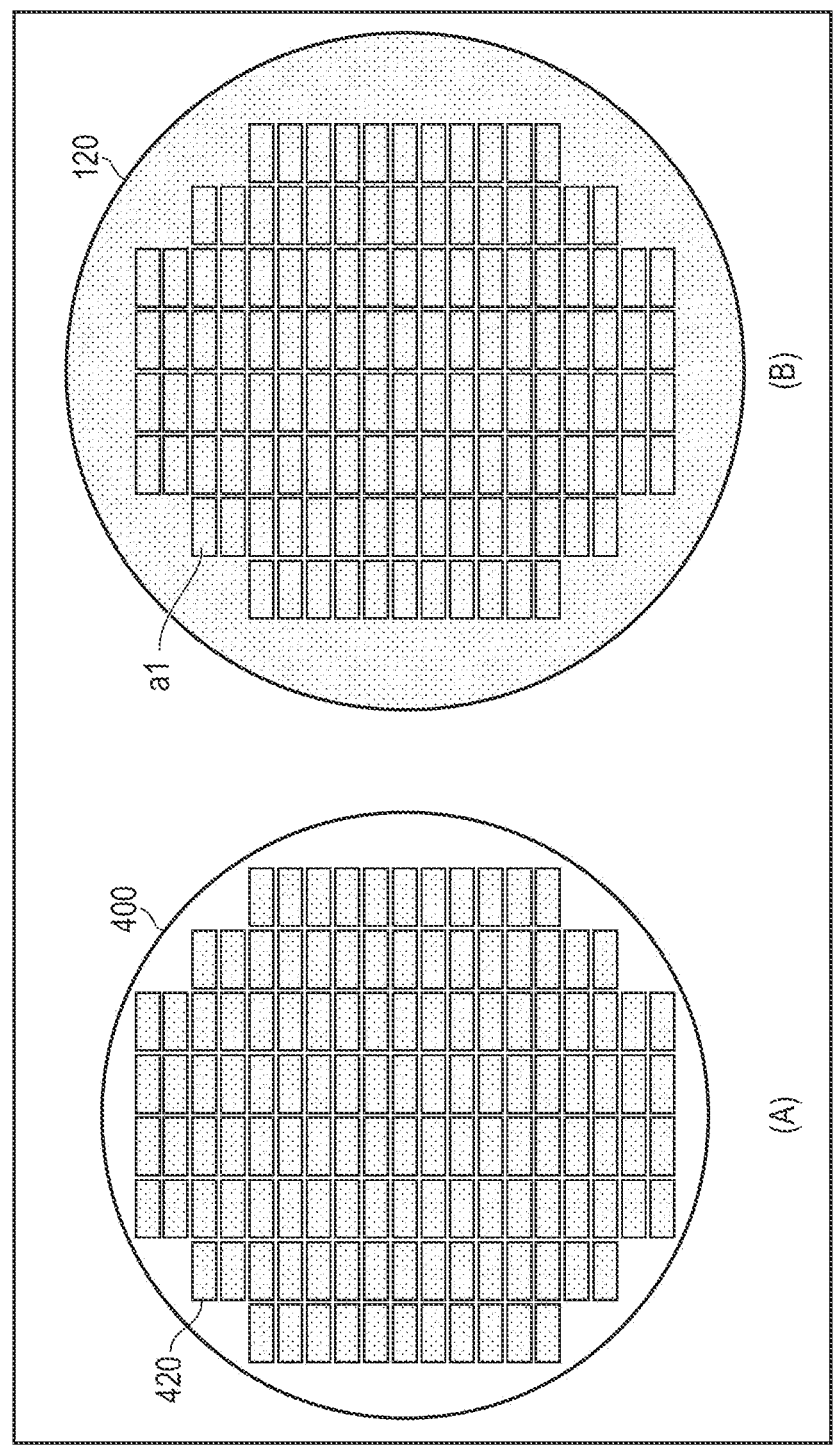
F I G. 4

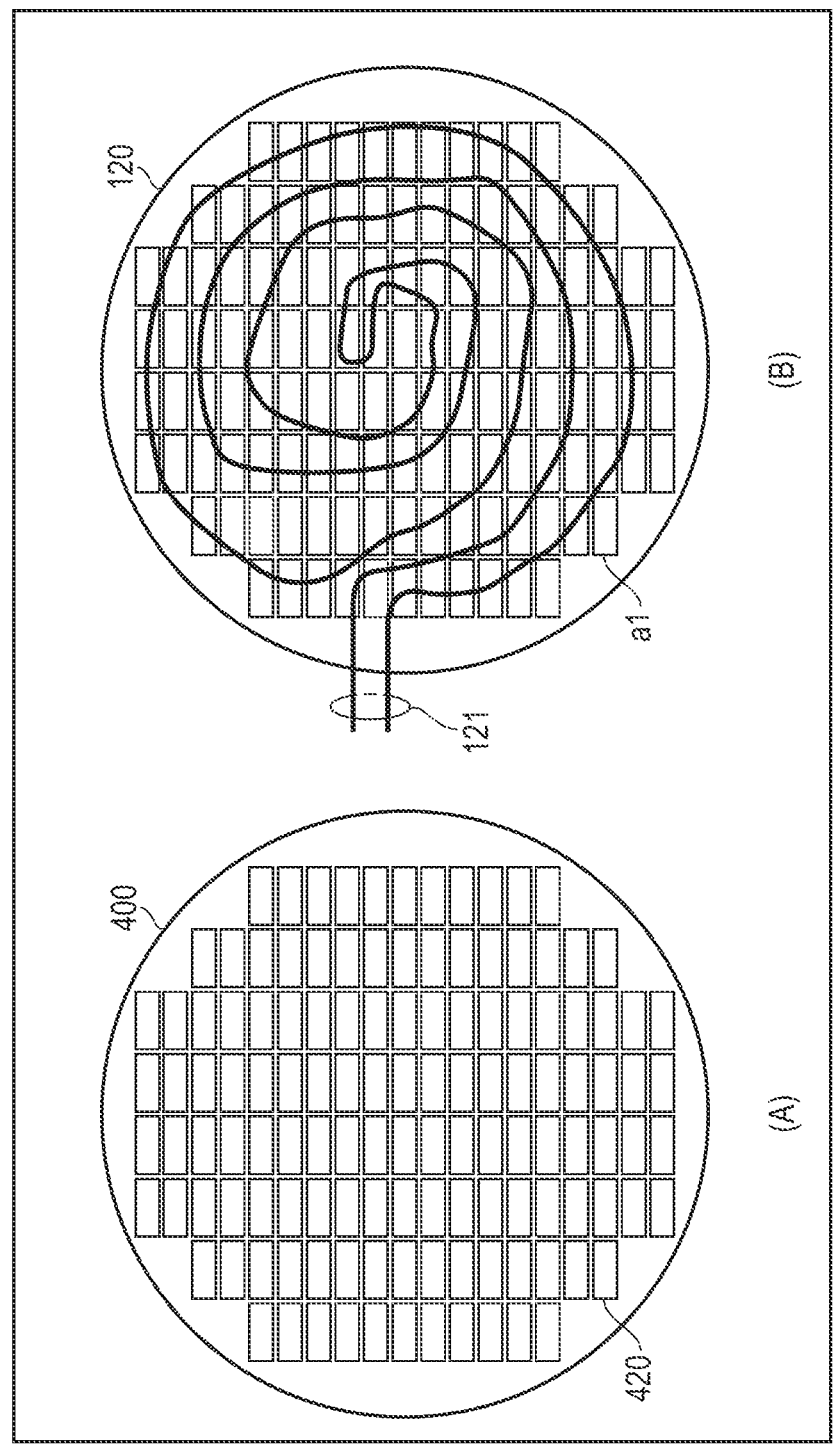
F I G. 6

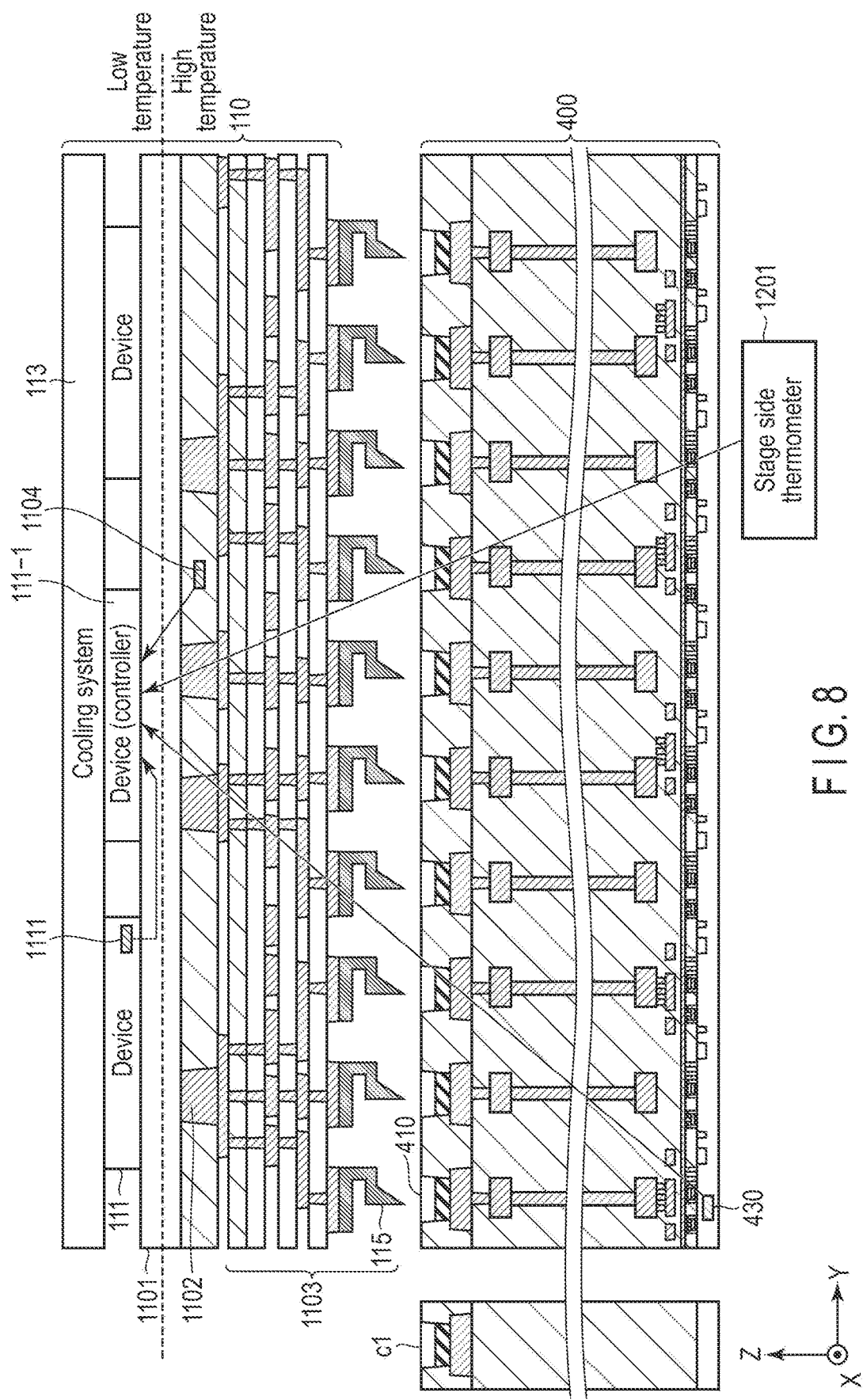
F I G. 8

STORAGE DEVICE AND CONTROL METHOD

CROSS-REFERENCE TO RELATED APPLICATIONS

This application is a Continuation Application of PCT Application No. PCT/JP2019/044931, filed Nov. 15, 2019, the entire contents of which are incorporated herein by reference.

FIELD

Embodiments described herein relate generally to a storage device and a control method.

BACKGROUND

Recently, various storage devices such as a solid state drive (SSD) and a hard disk drive (HDD) have been used. For example, a NAND flash memory mounted on an SSD is manufactured by forming a plurality of NAND flash memories as semiconductor chips on a semiconductor wafer and then dicing them.

Furthermore, a probe card is used as an inspection jig that relays electrical signals between the semiconductor wafer on which the semiconductor chips are formed and an inspection device that inspects the semiconductor chips. In simplified terms, the probe card is includes a printed circuit board PCB and a probe. A prober brings a pad electrode formed on the semiconductor wafer into contact with the probe of the probe card, and, for example, electrically connects a device on the printed circuit board PCB and the semiconductor wafer.

BRIEF DESCRIPTION OF THE DRAWINGS

FIG. 1 shows an example of a configuration of a storage device of an embodiment.

FIG. 4 is a diagram for explaining an example of a setting of a temperature control area relating to a stage in the storage device of the embodiment.

FIG. 6 shows an example of an arrangement of the heating and cooling system in the stage of the storage device of the embodiment.

FIG. 8 is a diagram for explaining an example of a mechanism in which a device on the probe card centrally controls the temperature of the prober in the storage device of the embodiment.

DETAILED DESCRIPTION

Figure 2:
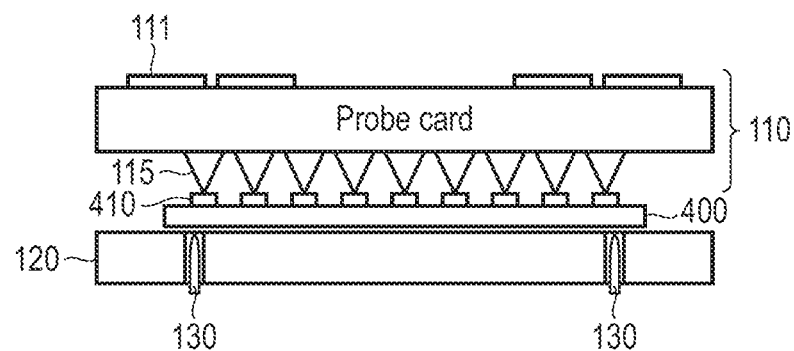
FIG. 2 shows a state in which a probe of a probe card is in contact with a pad electrode formed on a wafer in the storage device of the embodiment.

Embodiments will be described hereinafter with reference to the accompanying drawings.

In general, according to one embodiment, a storage device includes a control apparatus and a stocker. The control apparatus writes data to or reads data from a storage medium that includes a plurality of non-volatile memory chips. The stocker stores a plurality of the storage media that are detached from the control apparatus. The control apparatus includes a first temperature control system. The first temperature control system raises temperature of the storage medium to a first temperature or higher. The stocker includes a second temperature control system. The second temperature control system cools the storage medium to a second temperature or lower. The second temperature is lower than the first temperature.

FIG. 1 shows an example of a configuration of a storage device 1 of the present embodiment.

In the present embodiment, it is assumed that a probe card, which is an inspection jig, is diverted to build a large-capacity storage device 1 using semiconductor wafers without dicing the wafers. Furthermore, it is assumed that the semiconductor wafers that are electrically connectable to probes can be replaced and that a larger-capacity storage device 1 is built by using multiple semiconductor wafers.

In constructing such a storage device 1, it is preferable that the temperature of the semiconductor wafers in the prober be kept at high temperature, above room temperature, and the temperature be kept at a uniform temperature within the semiconductor wafer, while the temperature of the semiconductor wafers stored outside the prober be kept at low temperature, below the room temperature.

The storage device 1 includes a reader and writer (prober) 100, a storage conveyance system 200, and a stocker 300. In FIG. 1, an example where two probers 100 are provided is shown. However, it is not limited thereto, and the number of probers 100 may be changed in various ways. In addition, the storage device 1 includes an air conditioning control system 500 for replacing the atmosphere in the prober 100, the storage conveyance system 200, and the stocker 300 with dry air, noble gas, inert gas, or the like that does not contain water.

The storage device 1 is equipped with a semiconductor wafer (wafer 400), as a storage, on which a plurality of NAND flash memory chips (NAND chips) are formed. The storage device 1 is equipped with a plurality of wafers 400, and selects and uses a predetermined number of wafers 400 (two wafers 400 in the case of the example shown in FIG. 1) as appropriate from among the plurality of wafers 400. Specifically, the storage device 1 can replace the wafer 400 in the prober 100 with the wafer 400 in the stocker 300.

The prober 100 includes a probe card 110, a stage 120, and a drive unit 130.

The probe card 110 is a unit that electrically connects to the wafer 400 on the stage 120. As mentioned above, the probe card 110, in simplified terms, includes a printed circuit board PCB and a probe. In the storage device 1 of the present embodiment, a controller that controls writing of data to the NAND chip and reading of data from the NAND chip formed on the wafer 400, or the like, is mounted on the printed circuit board PCB of the probe card 110 as a device 111. In addition, in the storage device 1 of the present embodiment, a temperature control system (a heating and cooling system 112, a cooling system 113, and a heat insulating material 114) is provided in the probe card 110. The temperature control system provided in the probe card 110 will be described later.

The stage 120 is a unit that holds the wafer 400. In the storage device 1 of the present embodiment, a temperature control system (a heating and cooling system 121) is also provided in the stage 120. The temperature control system provided in the stage 120 will also be described later.

The drive unit 130 is a unit that moves the stage 120 to bring the probe of the probe card 110 into contact with pad electrodes formed on the wafer 400. Here, it is assumed that the drive unit 130 moves the stage 120, but it may also move the probe card 110. The drive unit 130 may also move both the probe card 110 and the stage 120. The drive unit 130 may also move the stage 120 so as to pull the probe that is in contact with the pad electrode away from the pad electrode.

FIG. 2 shows a state in which a probe 115 of the probe card 110 is in contact with a pad electrode 410 formed on the wafer 400 by the drive unit 130.

When the probe 115 comes into contact with the pad electrode 410, a controller mounted on the printed circuit board PCB of the probe card 11 as one of the devices 111 is electrically connected to the NAND chip that is formed on the wafer 400. This allows the controller to control writing of data to the NAND chip, reading of data from the NAND chip, and erasing of data in the NAND chip.

Returning to FIG. 1, the description of a configuration example of the storage device 1 will continue.

The storage conveyance system 200 includes a storage conveyer 210.

The storage conveyer 210 conveys the wafers 400, which are the storage in the storage device 1 of the present embodiment, from the stocker 300 to the prober 100, or from the prober 100 to the stocker 300. Note that the configuration described below is an example, and the means for conveying the wafers 400 is not limited thereto. The storage conveyer 210 can move in the vertical and horizontal directions. The storage conveyer 210 includes a support 211 that can be rotated with the vertical direction as an axis, and a tray 212 that, for example, has an elongated plate-like shape and is supported by the support 211 at one end so that the other end of the longitudinal direction protrudes in a horizontal direction. In the case of replacing the wafers 400 in the stocker 300, the storage conveyer 210 first performs operations for conveying wafers 400 from the prober 100 to the stocker 300. Specifically, the operations are performed by a procedure such as (1) moving the tray 212 in the vertical direction so that the height becomes a suitable height for taking out the wafer 400 in the prober 100, (2) rotating the tray 212 to face the prober 100 side, (3) moving the tray 212 in the horizontal direction toward the prober 100 side to hold the wafer 400 in the prober 100, (4) moving the tray 212 in the horizontal direction toward the opposite side of the prober 100 to detach the wafer 400 from the prober 100, (5) rotating the tray 212 to face the stocker 300 aide, (6) moving the tray 212 in the vertical direction so that the height becomes a suitable height for storing the wafer 400 in the stocker 300, (7) moving the tray 212 in the horizontal direction toward the stocker 300 side to store the wafer 400 in the stocker 300, and (8) moving the tray 212 in the horizontal direction toward the opposite side of the stocker 300 to remove the tray 212 from the stocker 300. This procedure is only an example and can be changed in various ways, such as reversing the order of (1) and (2), reversing the order of (6) and (7), etc.

Secondly, the storage conveyer 210 then performs an operation for conveying the wafer 400 from the stocker 300 to the prober 100. Since this procedure is similar to the operation for conveying the wafer 400 from the prober 100 to the stocker 300, descriptions thereof will be omitted.

The stocker 300 stores a plurality of wafers 400 which are detached from the prober 100. In the storage device 1 of the present embodiment, a temperature control system (cooling system 310) is also provided in the stocker 300. The temperature control system provided in the stocker 300 will be described later.

The air conditioning control system 500 is structured to separate the space in the prober 100 and the like from the outside air, and to replace the inside of the space with dry air, noble gas, inert gas, or the like by flowing them that are absorbed from outside into the space depressurized with an exhaust fan. The reason why the air conditioning control system 500 replaces the atmosphere in the prober 100, the storage conveyance system 200, and the stocker 300 with dry air, noble gas, inert gas, or the like that does not contain water will be explained later.

Figure 3:
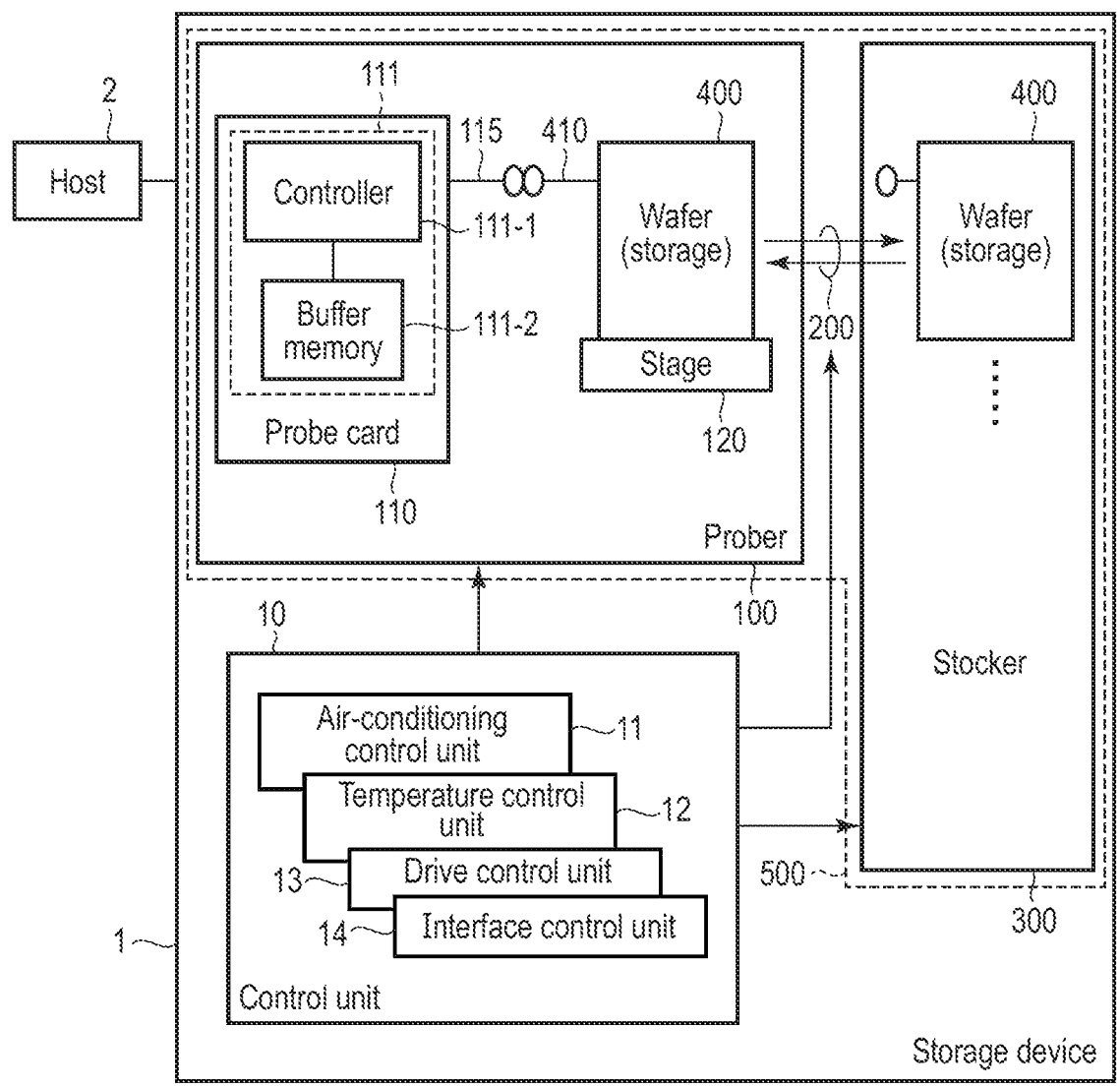
FIG. 3 is a schematic block diagram of the storage device of the embodiment.

FIG. 3 is a block diagram schematically showing the storage device 1 that includes the prober 100, the storage conveyance system 200, and the stocker 300 described with reference to FIG. 1.

As described above, in the storage device 1 of the present embodiment, a controller 111-1 that controls writing of data to the NAND chip and reading of data from the NAND chips formed on the wafer 400 is mounted on the printed circuit board PCB of the probe card 110 as one of the devices 111. A plurality of controllers 111-1 may be mounted. That is, all NAND chips on the wafer 400 can be controlled by a single controller 111-1 or by multiple controllers 111-1. FIG. 3 shows an example in which, in the same manner as the controller 111-1, a buffer memory 111-2 for temporarily storing write and read data is mounted on the printed circuit board PCB of the probe card 110 as one of the devices 111. The buffer memory 111-2 may be integrated into the controller 111-1.

The controller 111-1 is electrically connected to the NAND chip of the wafer 400 when the probe 115 of the probe card 110 comes in contact with the pad electrode 410 of the wafer 400 on the stage 120. The controller 111-1 is capable of controlling writing of data to the NAND chip and reading of data from the NAND chip in response to a request from a host 2. In addition, the wafer 400 in the prober 100 can be replaced with the wafer 400 stored in the stocker 300 by the storage conveyance system 200.

The storage device 1 includes a control unit 10. The control unit 10 includes, for example, an air conditioning control unit 11, a temperature control unit 12, a drive control unit 13, and an interface control unit 14, and controls the entire operation of the storage device 1. Each control unit of the control unit 10 is realized, for example, by a processor executing firmware. The air conditioning control unit 11 controls the air conditioning control system 500. The temperature control unit 12 integrally controls the temperature control system in the probe card 110 (the heating and cooling system 112 and the cooling system 113), the temperature control system in the stage 120 (the heating and cooling system 112), and the temperature control system in the stocker 300 (the cooling system 310). The drive control unit 13 controls the drive unit 130 and the storage conveyer 210. The interface control unit 14 controls the communication between the host 2 and the probe card 11. The interface control unit 14 controls the air conditioning control unit 11, the temperature control unit 12, and the drive control unit 13 based on the control results of the communication.

The writing of data to the NAND chip and the reading of data from the NAND chip of the wafer 400 are preferred to be performed at a high temperature (for example, 75° C., but, for example, 85° C. or lower), above room temperature. More specifically, when data is written to and read from a memory cell in a NAND chip, the higher the temperature, the deeper and more stable the level at which electrons are trapped in the charge storage layer of the memory cell becomes, thereby reducing variations in noise per electron. Therefore, high temperature is preferable. On the other hand, for long-term storage of data in the NAND chip, low temperature (for example, 0° C. or lower), below the room temperature, is preferred. In more detail, charge retention time can be lengthened by suppressing the phonon scattering of the charge stored in the NAND chip. Therefore, low temperature is preferable when storing the wafer 400. Also, it is preferable to operate the device 111 implemented on the probe card 110 at a temperature equal to or lower than a threshold value. Thus, in the case of using the wafers 400 as storage, various temperature controls are required within the storage device 1. Therefore, the storage device 1 of the present embodiment has a temperature control system provided for each of the prober 100, the storage conveyance system 200, and the stocker 300, so that appropriate temperature control may be performed for the storage device 1 as a whole. This point is described in detail below.

First, the temperature control system provided in the prober 100 will be described.

As mentioned above, in the prober 100, temperature control systems are installed in the probe card 110 and in the stage 120.

In the stage 120 that holds the wafer 400, the heating and cooling system 121 is provided (see FIG. 1) to make the temperature in the wafer 400 electrically connected to the probe card 110 on the stage 120 as uniform as possible. The heating and cooling system 121 is a temperature control system using, for example, electric heating and cooling tubes. To control the temperature of the wafer 400 by the stage 120, the storage device 1 sets a temperature control area for each of areas smaller than the wafer 400, for example, for each NAND chip area in the wafer 400, so that different temperature control can be performed for each of them.

FIG. 4 is a diagram for explaining an example of a setting of the temperature control area relating to the stage 120 in the storage device 1 of the present embodiment.

FIG. 4, part (A) shows a top surface of the wafer 400 and an example of one formation of a NAND chip 420 in the wafer 400. On the other hand, FIG. 4, part (B) shows a top surface of the stage 120 holding the wafer 400, and shows an example of a setting of a temperature control area a1 for the stage 120.

As shown in FIG. 4, in the storage device 1 of the present embodiment, for example, a plurality of temperature control areas a1 are set on the stage 120 so that they correspond one-to-one in position to a plurality of NAND chips 420 formed on the wafer 400 that is disposed on the stage 120.

For example, the plurality of temperature control areas a1 can also be set so that one area corresponds to two or more NAND chips 420 in position. The number of NAND chips to which the temperature control area a1 corresponds does not have to be the same for all the temperature control areas a1.

Figure 5:
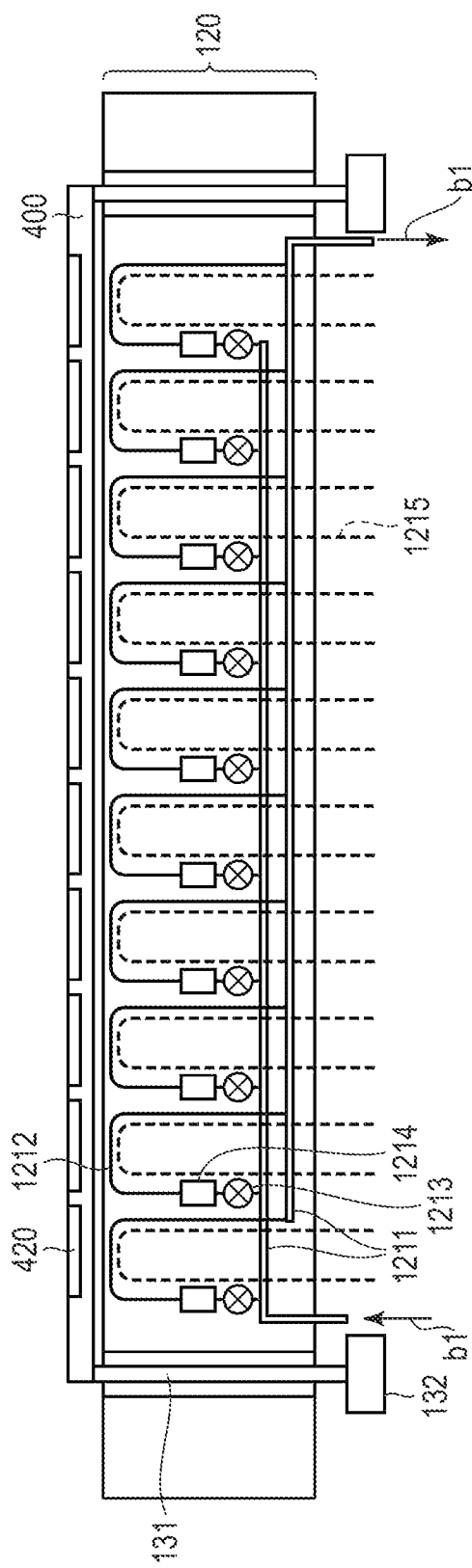
FIG. 5 shows an example of a configuration of a heating and cooling system provided in the stage of the storage device of the embodiment.

FIG. 5 shows an example of a configuration of the heating and cooling system 121 provided in the stage 12 to control the temperature of each temperature control area a1 set as shown in, for example, FIG. 4.

The cooling system of the heating and cooling system 121 has a structure in which refrigerant b1 is distributed from one of two cooling tubes 1211 to the other via a cooling branch tube 1212. The refrigerant b1 is water or liquid nitrogen, etc., cooled by electronic cooling. The cooling branch tube 1212 is disposed so that the wafer 400 on the stage 120 can be cooled per the temperature control area a1 set on the stage 120. The cooling by the cooling branch tube 1212 is controlled by the inflow amount of the refrigerant b1. To control the inflow amount of the refrigerant b1, an electronically controlled motor valve 1213 and a flow meter 1214 are installed, for example, near the inlet of the cooling branch tube 1212.

On the other hand, the heating system of the heating and cooling system 121 is, for example, configured by using heater wires 1215 that are disposed to heat the wafer 400 on the stage 120 per the temperature control area a1 set on the stage 120. The heating by the heater wires 1215 can be controlled by, for example, a switch for switching whether or not to perform heating and a variable resistor for adjusting the calorific value.

Note that, although details will be described later, the heating and cooling system 121 of the stage 120 configured in this manner is controlled by, for example, the controller 111-1 mounted on the probe card 110. In the stage 120 is provided, for example, a thermometer capable of outputting temperature data to an $I^2C$ bus. A thermometer may also be provided in the wafer 400.

Between the probe card 110 and the stage 120, a communication path is provided that is capable of transferring the temperature measured by the thermometer provided in the stage 120 or in the wafer 400 to the controller 111-1. In cooperation with the control unit 10, the controller 111-1 controls the heating and cooling system 121 of the stage 120 based on the temperature measured by the thermometer provided in the stage 120 or in the wafer 400. In a case where there are multiple controllers 111-1, one of them may be responsible for controlling the heating and cooling system 121, or multiple controllers 111-1 may work in cooperation to control the heating and cooling system 121. The control of the temperature control systems (the heating and cooling system 112 and the cooling system 113) provided in the probe card 110, as described below, is also executed by the controller 111-1. In other words, the temperature control systems in the prober 100 are centrally controlled by the controller 111-1. A device for centrally controlling the temperature control systems in the prober 100 may be provided separately from the controller 111-1 and mounted on the probe card 110. Alternatively, a device other than the controller 111-1 may be equipped with a function for centrally controlling the temperature control systems in the prober 110.

Also, FIG. 5, a lift pin 131 and an actuator 132 of the drive unit 130 are shown together. The lift pin 131 is a member that is fitted into a hole provided on the stage 120 and moves the stage 120 in a vertical direction or a horizontal direction. The actuator 132 can move the stage 120 in the vertical or the horizontal direction by moving the lift pin 131 in the vertical or the horizontal direction. The movement in the horizontal direction is performed to align the positions of the pad electrode 410 of the wafer 400 and the probe 115 of the probe card 110. On the other hand, the movement in the vertical direction is performed so that the pad electrode 410 of the wafer 400 and the probe 115 of the probe card 110 come in contact, or so that the pad electrode 410 and the probe 115 that are in a contact state are separated.

FIG. 6 shows an example of an arrangement of the heating and cooling system 121 in the stage 120, which is configured as shown in, for example, FIG. 5.

FIG. 6, part (A) shows a top surface of the wafer 400 and an example of one formation of a NAND chip 420 in the wafer 400. On the other hand, FIG. 6, part (B) shows a top surface of the stage 120 holding the wafer 400, and an example of an arrangement of the heating and cooling system 121 in the stage 120.

The cooling branch tubes 1212 for cooling and the heater wires 1215 for heating provided in the heating and cooling system 121 described with reference to FIG. 5 do not necessarily have to be disposed to go through all the temperature control areas a1, as shown in FIG. 6, part (B). For example, one or more cooling branch tubes 1212 in the vicinity or one or more heater wires 1215 in the vicinity can be used to control the temperature of the desired temperature control area a1.

Figure 7:
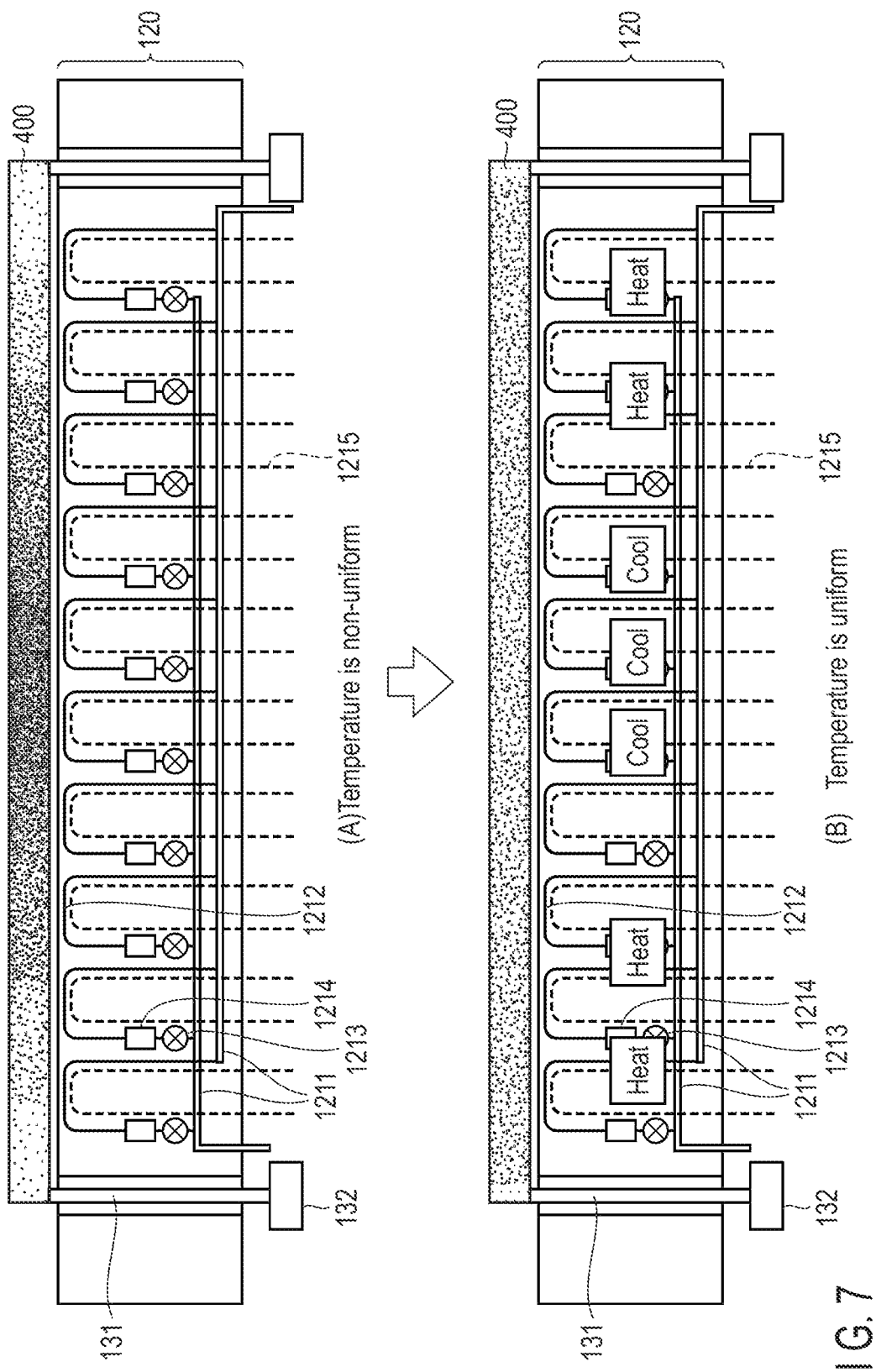
FIG. 7 is a diagram for explaining an example of a temperature control by the heating and cooling system provided in the stage in the storage device of the embodiment.

FIG. 7 is a diagram for explaining an example of temperature control by the heating and cooling system 121 provided in the stage 120.

FIG. 7, part (A) shows an example of a case where the temperature in the wafer 400 on the stage 120 is non-uniform. Specifically, it shows a state in which the wafer 400 has high temperature in the center and lower temperature from the center to the edge.

On the other hand, FIG. 7, part (B) shows an example of temperature control by the heating and cooling system 121 in a case where the wafer 400 is in the state shown in FIG. 7, part (A).

In this case, to uniformize the temperature, for the center of the wafer 400, cooling is performed by flowing the refrigerant b1 into the cooling branch tube 1212 that is disposed in the center, and, for the edge of the wafer 400, heating is performed by generating heat for the heater wire 1215 disposed at the edge. In this process, the flow rate of the refrigerant b1 to the cooling branch tube 1212 is controlled to increase as it gets closer to the center and decrease as it gets further away from the center. Instead, the calorific value of the heater wire 1215 is controlled to become smaller as it gets closer to the center and larger as it gets further away from the center.

In this manner, in the storage device 1 of the present embodiment, in which the heating and cooling system 121 is provided in the stage 120, the temperature in the wafer 400 on the stage 120 can be controlled to be uniform. Note that, in FIG. 7, for the sake of clarity, a state in which the temperature in the center of the wafer 400 rises, and the temperature in the wafer 400 becomes non-uniform is shown. However, the non-uniformity of the temperature in the wafer 400 may appear in various states depending on an access status to the NAND chip 420, etc. In the storage device 1 of the present embodiment, which sets a plurality of temperature control areas a1 on the stage 120, no matter in what state the non-uniformity of temperature appears, the temperature in the wafer 400 can be appropriately uniformized.

In addition, although details of the cooling system 310 of the stocker 300 will be described later, the wafer 400 stored in the stocker 300 is cooled to low temperature, below room temperature, which is suitable for long-term storage of data. In contrast, it is preferred that writing of data to the NAND chip 420 and reading of data from the NAND chip 420 be performed at high temperature, above room temperature. In the storage device 1 of the present embodiment in which the heating and cooling system 121 is provided in the stage 120, when replacing the wafer 400 in the prober 100, it is possible to raise the temperature of the wafer 400 conveyed from the stocker 300 at low temperature to temperature suitable for writing data to the NAND chip 420 and reading data from the NAND chip 420 before being electrically connected to the probe card 110. Furthermore, upon contact, it is also possible to prevent both the probe 115 of the probe card 110 and the pad electrode 410 of the wafer 400 from being damaged.

In addition, in the storage device 1 of the present embodiment where the stage 120 is provided with the heating and cooling system 121, when replacing the wafer 400 in the prober 100, the wafer 400 on the stage 120 maintained above room temperature can be cooled, for example, below room temperature on the stage 120 after it is electrically disconnected from the probe card 110, and before it is conveyed to the stocker 300. By storing the wafer 400 that has been cooled on the stage 120, in the stocker 300, it is possible to prevent the temperature in the stocker 300 from rising, even if temporarily, and prevent the effect on other wafers 400 in the stocker 300. Furthermore, a cooling system may also be provided in the storage conveyance system 200 interposed between the prober 100 and the stocker 300 to cool the wafer 400 that has been maintained above room temperature on the stage 120 of the prober 100 to below room temperature.

As the temperature control system in the probe card 110, the heating and cooling system 112, the cooling system 113, and the heat insulating material 114 (see FIG. 1) are provided.

The heating and cooling system 112 is, for example, a temperature control system using electric heating and cooling tubes similar to the heating and cooling system 121 of the stage 120. Since it may be similar to the heating and cooling system 121 of the stage 120, descriptions of the configuration thereof will be omitted. It may also be configured differently from the heating and cooling system 121 of the stage 120.

The heating and cooling system 112 is provided on, for example, the bottom surface side in the probe card 110, facing the wafer 400 on the stage 120, so that the temperature of the probe card 110 roughly matches the temperature of the wafer 400, or more precisely, so that the temperature of the probe 115 roughly matches the temperature of the pad electrode 410.

This enables the storage device 1 of the present embodiment to stabilize the electrical connection between the wafer 400 and the probe card 110 when the probe 115 contacts the pad electrode 410.

The cooling system 113 of the probe card 110 is, for example, a temperature control system using heat dissipation or cooling tubes. The cooling system 113 is provided on, for example, the top surface side in the probe card 110 to operate the device 111 mounted on the printed circuit board PCB of the probe card 110 at a temperature equal to or lower than a threshold value; in other words, so that the temperature of the device 111 does not exceed the threshold value. The control of the cooling system 113 is executed by the controller 111-1, which is one of the devices 111. The controller 111-1 controls the cooling system 113 based on the temperature of the controller 111-1 measured by itself or the temperature measured by other devices on the printed circuit board PCB. The cooling system 113, like the heating and cooling system 112 and the heating and cooling system 121 of the stage 120, can control the temperature in each temperature control area set in advance. This temperature control area may correspond to the temperature control area a1 set on the stage 120, or may be set independently.

This allows the storage device 1 of the present embodiment to continue operating the device 111 mounted on the probe card 110 in appropriate environment.

In addition, the probe card 110 is provided with a heat insulating material with high thermal resistance between, for example, the top surface where the device 111 is mounted and, for example, the bottom surface facing the wafer 400. By installing the heat insulating material 114, the storage device 1 of the present embodiment thermally insulates the inside of the probe card 110 between the top surface side and bottom surface side, enabling different temperatures to be maintained, respectively. More specifically, for example, the top surface side can be maintained at temperature suitable for the device 111, and, for example, the bottom surface side can be maintained at temperature that roughly matches the temperature of the wafer 400 on the stage 120.

FIG. 8 is a diagram for explaining an example of a mechanism in which the device 111 (the controller 111-1) on the probe card 110 centrally controls the temperature of the prober 100 in the storage device 1.

The probe card 110 is provided with a ceramic printed circuit board PCB 1101 having high heat dissipation effect. Some of the devices 111 disposed on, for example, the top surface of this ceramic printed circuit board PCB 1101 includes a thermometer 1111 that measures the temperature of the device 111. The controller 111-1 also includes the thermometer 1111. The controller 111-1 first executes temperature control using the cooling system 113 so that the temperature of the device 111 is maintained at or below a threshold value based on the temperature measured by these thermometers 1111, including its own thermometer 1111. As described above, the controller 111-1 can execute temperature control using the cooling system 113 in each temperature control area that is set in advance. The thermometer 1111 that measures the temperature of the device 111 may be outside the device 111.

For example, on the bottom surface of the ceramic printed circuit board PCB 1101, a probe unit 1103 is disposed via an interposer 1102. The probe 115 is provided at a distal end portion of the probe unit 1103. Furthermore, on the bottom surface side of the ceramic printed circuit board PCB 1101, for example, a thermometer 1104 that can output temperature data to the controller 111-1 is provided.

In addition, as mentioned above, a thermometer (430, 1201) is provided in at least one of the wafer 400 and the stage 120. The controller 111-1 secondly executes temperature control using the heating and cooling system 112 of the probe card 11 and the heating and cooling system 121 of the stage 120 so that the temperature of the probe 115 and the temperature of the pad electrode 410 roughly match based on the temperature measured by the thermometer 1104 provided in the probe card 110 and the temperature measured by the thermometer 430 provided in the wafer 400 or the temperature measured by the thermometer 1201 provided in the stage 120. At the same time, the controller 111-1 executes temperature control using the heating and cooling system 121 of the stage 120 so that the temperature in the wafer 400 becomes uniform.

In other words, in the storage device 1 of the present embodiment, the device 111 disposed on the probe card 110 is capable of monitoring the temperature of multiple locations of the probe card 110, the stage 120, and the wafer 400 on the stage 120.

Note that, in FIG. 8, a formation on the wafer 400 indicated by symbol c1 is an alignment mark used for aligning the probe 115 of the probe card 110 with respect to the pad electrode 410. Furthermore, in FIG. 8, the X direction is a direction of word lines and the Y direction is a direction of the bit lines. The movement of the stage 120 holding the wafer 400 in the horizontal direction by the drive unit 130 is performed with reference to this alignment mark c1. The probe card 110 may be provided with a camera for detecting a representative position (here, the alignment mark c1) on the wafer 400. The drive control unit 13 can recognize a reference position more accurately based on the information from the camera, and can perform precise alignment.

Figure 9:
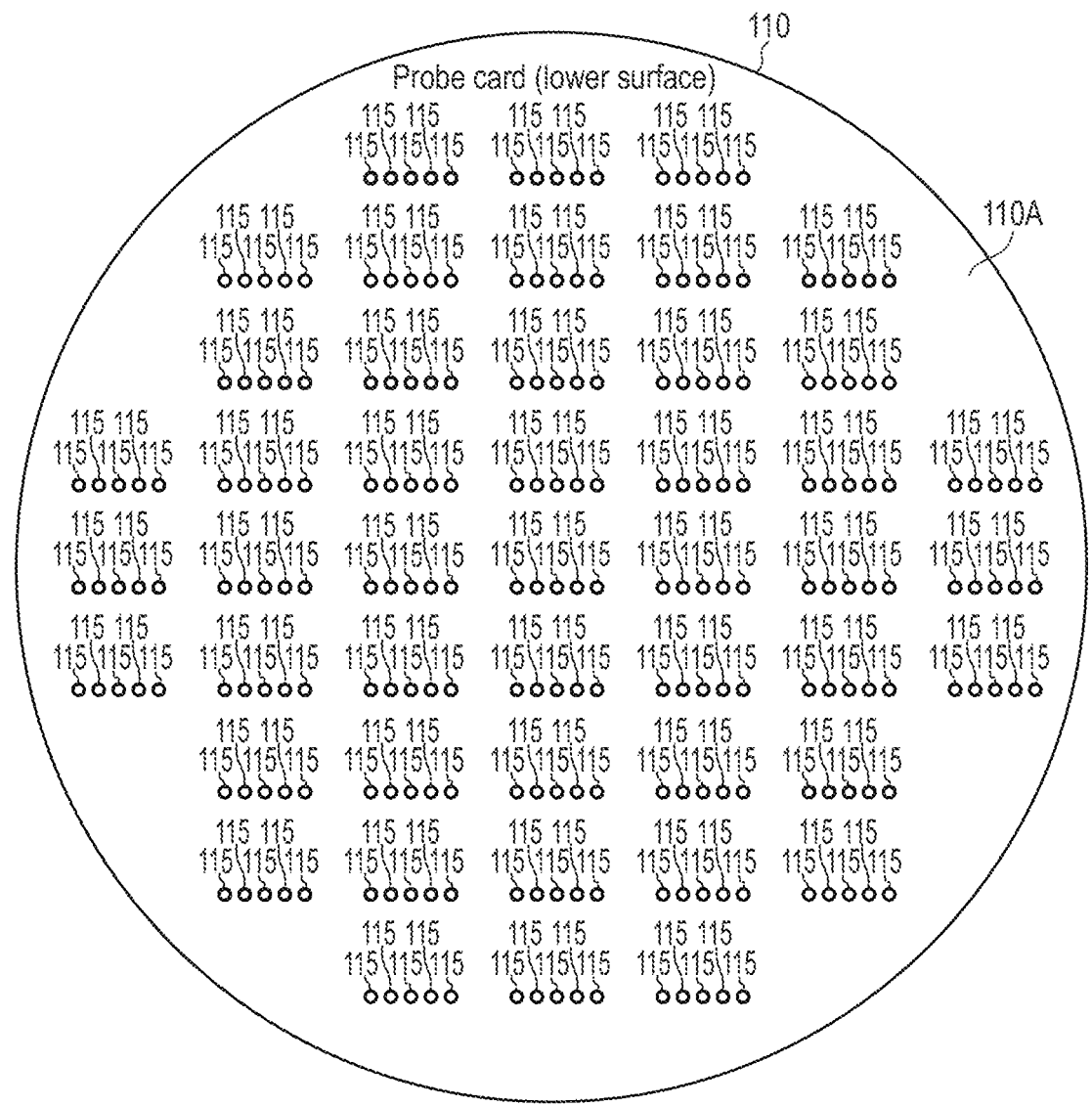
FIG. 9 shows a plurality of probes disposed on a first side of the probe card in the storage device of the embodiment.

FIG. 9 shows a plurality of probes 115 disposed on a first surface 110A of the probe card 110.

In FIG. 9, a case is exemplified in which the same number of probes 115 as the number of pad electrodes 410 of all NAND chips 420 of the wafer 400 are disposed on the first surface 110A of the probe card 110.

In this case, the probes 115 of the probe card 110 are in contact with all pad electrodes 410 of all NAND chips 410 in the wafer 400 all at once, and all the NAND chips can be controlled by the controller 111-1.

Figure 10:
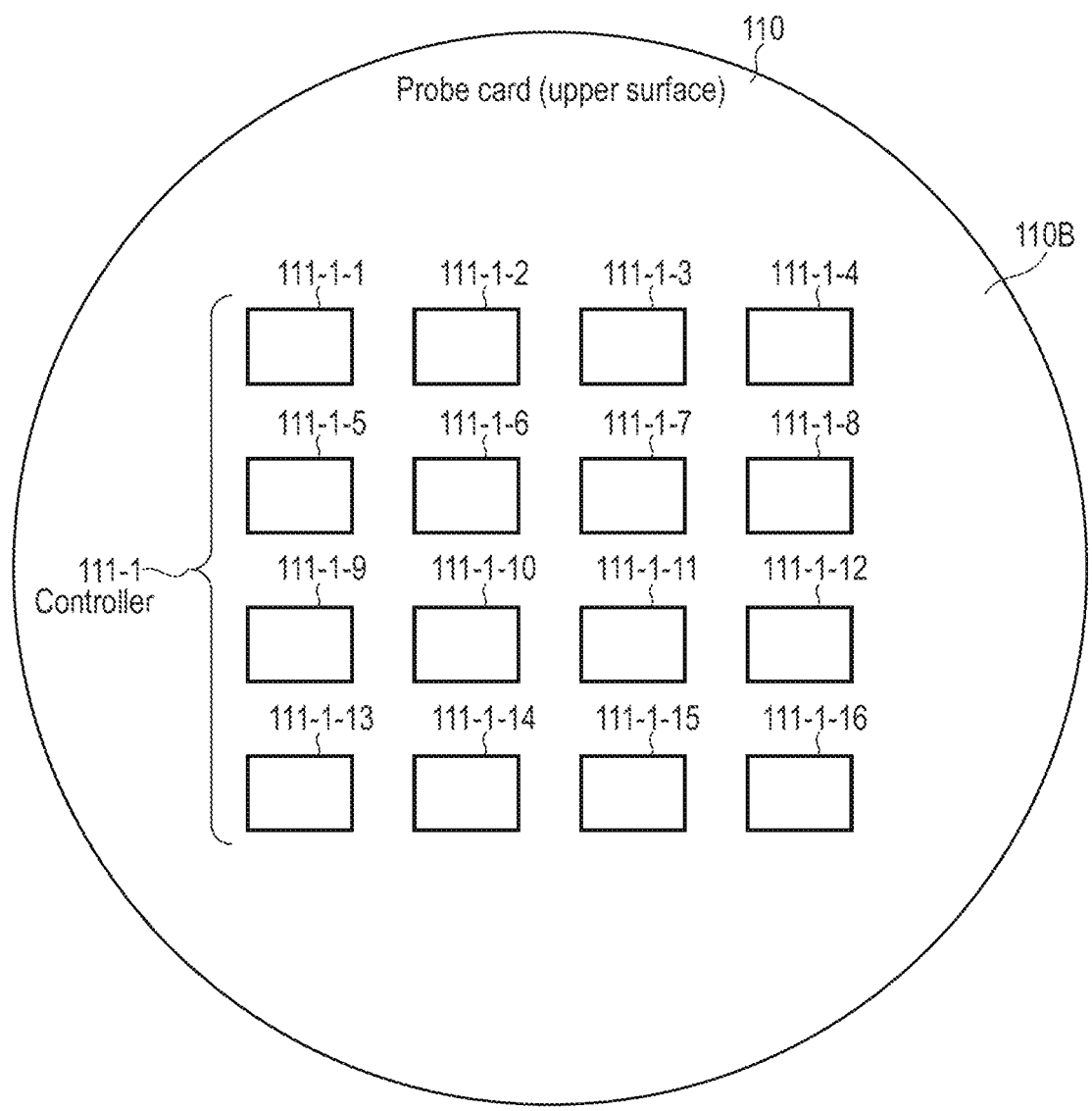
FIG. 10 shows a plurality of controllers disposed on a second side of the probe card in the storage device of the embodiment.

FIG. 10 shows a plurality of controllers 111-1 disposed on a second surface 110B of the probe card 110.

In FIG. 10, a case in which 16 controllers 111-1 (controllers 111-1-1, 111-1-2, . . . , 111-1-16) are disposed is exemplified. In a case where a single wafer includes 1024 NAND chips 420, and 16 controllers 111-1 are disposed on the second surface 110B of the probe card 110, each controller 111-1 should control 64 NAND chips 420 via the probe 115.

Figure 11:
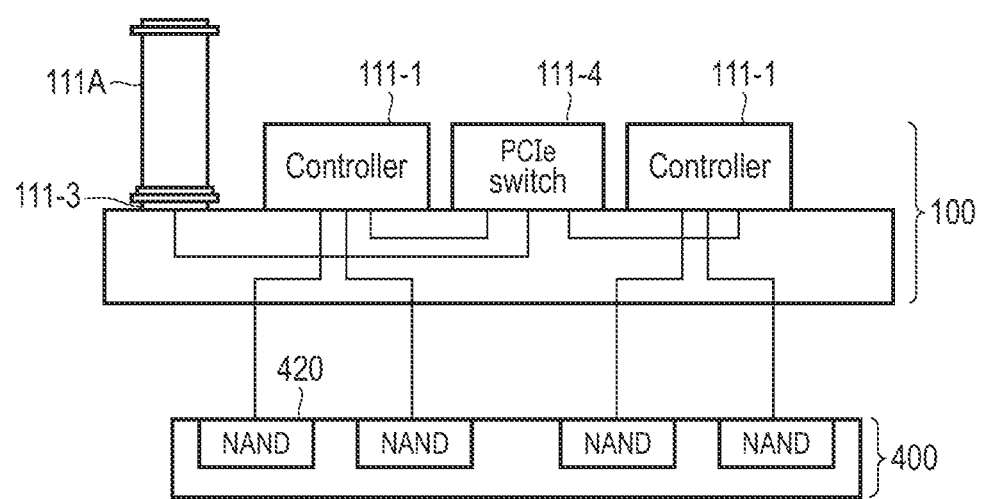
FIG. 11 is a diagram for explaining an example of an operation of the device implemented on the prober in the storage device of the embodiment.

FIG. 11 is a diagram for explaining an example of an operation of the device 111 implemented on a prober 100.

Here, it is assumed that a plurality of controllers 111-1 share control of a plurality of NAND chips 420 formed on the wafer 400. In other words, it is assumed that multiple controllers 111-1 are disposed on the probe card 110.

A connector 111-3 into which a riser cable 111A for connecting the probe card 110 to an external device, such as the host 2 (see FIG. 3), is inserted is disposed on the probe card 110. An interface switch (for example, a PCIe (registered trademark) switch) 111-4 for exclusively and selectively connecting to the connector 111-3 and one controller 111-1 among multiple controllers 111-1 is disposed on the probe card 110. By the interface switch 111-4 switching appropriately, for example, when data read is requested from the host 2, the data read request is transmitted to the controller 111-1 that controls the corresponding NAND chip 420. The controller 111-1 that receives this request reads the data from the NAND chip 420, and transmits the read data to the host 2. The data transmitted from the controller 111-1 is relayed to the connector 111-3 by the interface switch 111-4, and is transferred to the host 2 via the riser cable 111A.

In the storage device 1 of the present embodiment, the temperature of these multiple devices 111 that are disposed on the probe card 110 is maintained at or below a threshold value by the cooling system 113 of the probe card 110. Furthermore, in addition to the controller 111-1 and the interface switch 111-4, various LSI chips and semiconductor components such as FPGAs, relays, capacitors, etc., may be implemented on the prober 100.

Next, the cooling system 310 provided in the stocker 300 will be described.

Figure 12:
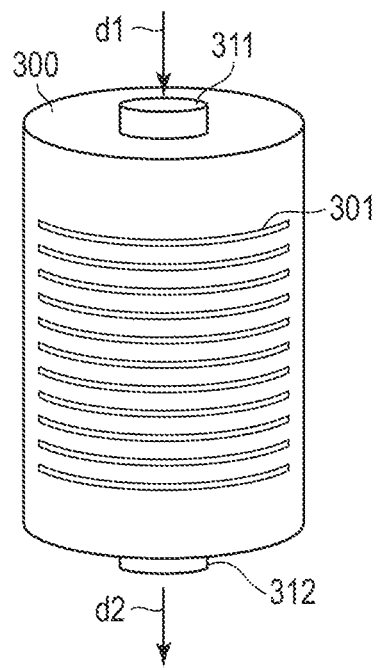
FIG. 12 shows a first example of a cooling system provided in a stocker in the storage device of the embodiment.

FIG. 12 shows a first example of the cooling system 310.

The stocker 300 is provided with the same number of shutters 301 that open and close when the wafers 400 are taken in and out, as the number of wafers 400 that can be stored therein. When taking out the wafers 400 from the stocker 300 or storing the wafers 400 in the stocker 300, to prevent cool air in the stocker 300 from escaping, any shutter 301 among the plurality of shutters 301 is selectively opened and closed. Note that the stocker 300 may also be configured to have one shutter 301 and move the entire stock of the storages (wafers 400) stored therein up and down.

In the first example, the stocker 300 is provided with an intake port 311 for feeding cooling air d1, and an exhaust port 312 for discharging cooling air d2 that has flowed through the stocker 300. The cooling air d1 is, for example, cooled air under high pressure. The cooling system 310 of the stocker 300 in the present example closes the entrance and exit of the wafer 400 with the shutter 301, continues to feed the cooling air d1 from the intake port 311, and continues to fill the stocker 300 with the cooling air d1 that is kept below room temperature, to thereby cool the entire stocker 300. In other words, the wafer 400 in the stocker 300 is cooled so that the temperature becomes suitable for long-term storage of data.

Figure 13:
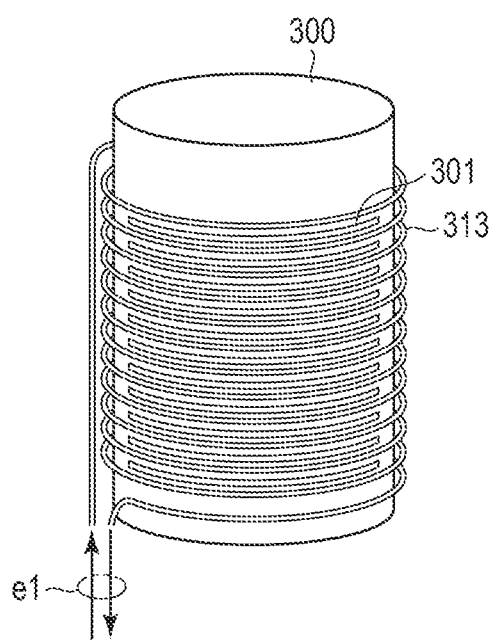
FIG. 13 shows a second example of the cooling system provided in the stocker in the storage device of the embodiment.

FIG. 13 shows a second example of the cooling system 310.

In the second example, a cooling tube 313 for distributing refrigerant e1 is provided, for example, on the side peripheral wall of the stocker 300 so as to cover the entire side surface of the stocker 300. The refrigerant e1 is water or liquid nitrogen cooled by electronic cooling. The cooling system 310 of the stocker 300 in the present example closes the entrance and exit of the wafers 400 by the shutters 301, distributes the refrigerant e1 to the cooling tube 313 provided on the peripheral wall of the stocker 300, and cools the air inside the stocker 300, to thereby cool the entire stocker 300. In other words, the wafer 400 in the stocker 300 is cooled to temperature suitable for long-term storage of data. Note that the cooling tube 313 may be provided inside the stocker 300.

In addition to using the cooling air d1 and the refrigerant e1, for example, an electronic cooling system using Peltier elements may be provided on a portion supporting the wafer 400 in the stocker 300, a portion connected to this support portion, or the entire stocker 300, to thereby cool the wafer 400 in the stocker 300.

In this manner, in the storage device 1 of the present embodiment in which the stocker 300 is provided with the cooling system 310, it is possible to store the wafers 400 in the stocker 300 while maintaining low temperature below room temperature, which is suitable for long-term storage of data.

Next, the air conditioning control system 500 (see FIG. 1) will be described.

As described above, the wafers 400 in the stocker 300 are cooled to low temperature below room temperature. Therefore, in the case of taking out a wafer 400 from the stocker 300 and conveying the wafer 400 to the prober 100 to replace a wafer 400 in the prober 100 with the wafer 400 in the stocker 300, there is a possibility that the water vapor in the air in the storage conveyance system 200 may condense (i.e., condensation may occur) on the low-temperature wafer 400 and on the storage conveyer 210 that conveys the wafer 400. To prevent this condensation, the storage device 1 of the present embodiment is provided with the air conditioning control system 500 to replace the atmosphere in the storage conveyance system 200 with dry air, noble gas, inert gas, or the like that does not contain water.

The air conditioning control system 500 not only replaces the atmosphere in the storage conveyance system 200 but also in the prober 100 and the stocker 300 with dry air, noble gas, inert gas, or the like that does not contain water. As a result, in the storage device 1 of the present embodiment, condensation can be prevented almost completely on the wafer 400. Note that, since it is preferable that there is no oxygen in addition to water in the space where the wafer 400 is handled, it is preferable to replace the atmosphere in the prober 100, the storage conveyance system 200, and the stocker 300 with noble gas or inert gas.

Furthermore, since it is preferable to cool not only the inside of the stocker 300 but also the inside of the storage conveyance system 200 that conveys, to the stocker 300, the wafers 400 that have been maintained at high temperature above room temperature in the prober 100, the cooling system may also be provided in the storage conveyance system 200 as described above.

Furthermore, the stocker 300 is cooled to maintain the charge retention properties of the NAND chips 420 of the wafers 400 for a long time. The temperature of the wafer 400 may be at room temperature; however, since the cooler the temperature, the higher the charge retention property is, a temperature of 0° C. or lower may also be used. However, at the low temperature equal to or lower than 0° C., there may be electrical side effects due to condensation of water in the atmosphere, such as a short circuit between wires. From this point of view, it is preferable to replace the atmosphere in the stocker 300 with dry air, noble gas such as argon, or inert gas such as nitrogen that does not contain water.

In this manner, in the storage device 1 of the present embodiment that is provided with the air conditioning control system 500, which is a kind of temperature control system, condensation can be prevented on the wafer 400 and on the storage conveyer 210.

Figure 14:
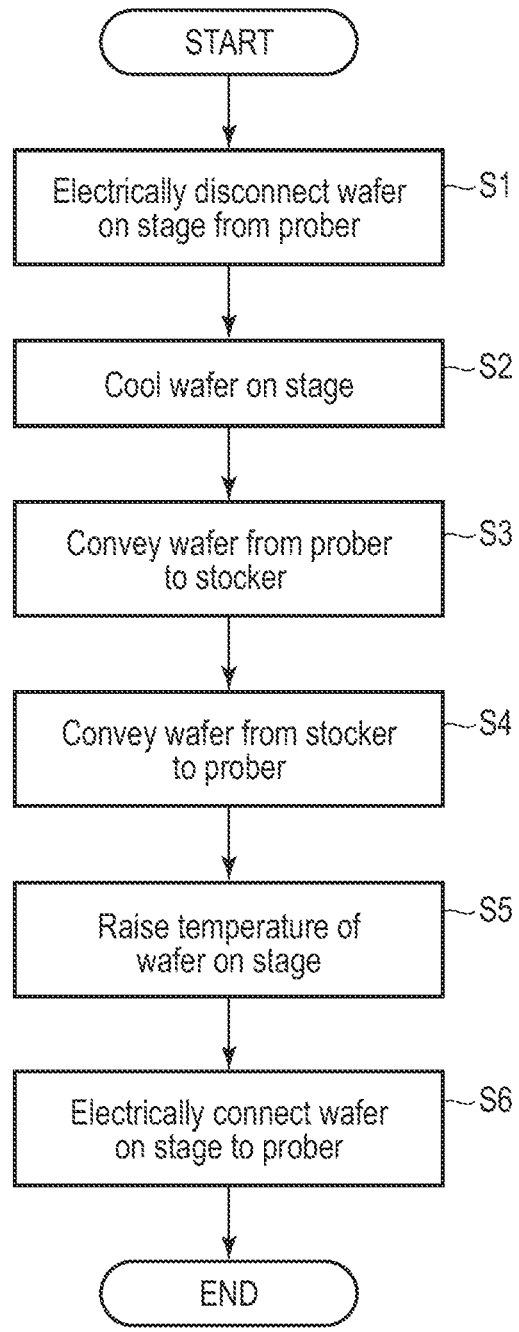
FIG. 14 is a flowchart showing an example of a flow of temperature control during wafer replacement executed in the storage device of the embodiment.

FIG. 14 is a flowchart showing an example of a flow of the temperature control at the time of replacement of the wafer 400 executed in the storage device 1 of the present embodiment.

The storage device 1 electrically disconnects the wafer 400 from the probe card 110 using the drive unit 130 (S1). The storage device 1 cools the wafer 400 electrically disconnected from the probe card 110 on the stage 120 (S2). In this process, the controller 111-1 acquires the temperature from the thermometer (430, 1201) through, for example, the I²C bus. The storage device 1 conveys the wafer 400 cooled, for example, below room temperature from the prober 100 to the stocker 300 by the storage conveyance system 200 (S3).

Subsequently, the storage device 1 conveys the wafer 400 to be accommodated in the prober 100 in replacement with the wafer 400 taken out from the prober 100, from the stocker 300 to the prober 100 using the storage conveyance system 200 (S4). The storage device 1 raises the temperature of the wafer 400 to be electrically connected to the probe card 110 on the stage (S5). Again, in this process, the controller 111-1 acquires the temperature from the thermometer (430, 1201) through, for example, the I²C bus. The storage device 1 electrically connects the wafer 400, which has been raised to, for example, temperature above room temperature that is suitable for writing and reading data to the NAND chip 420, with the probe card 110 using the drive circuit (S6).

As described above, the storage device 1 of the present embodiment, in which the temperature control system is provided in each of the prober 100, the storage conveyance system 200, and the stocker 300, can appropriately perform various temperature controls for the wafer 400.

In addition, the heating and cooling system 121 provided in the stage 120 of the prober 100 can be used to refresh the wafer 400. The refresh is a process for leveling variations in properties between memory cells in a NAND chip for writing or reading of data, which have been degraded by read/write stress. This process also recovers the data retention function of the NAND chip. For example, to recover degradation by annealing at approximately 300° C., the temperature of the wafer 400 is raised on the stage 120 and the refresh is performed. For this purpose, an intake port provided in the prober 100 and a supply system provided in the prober 100 for nitrogen, argon, helium, krypton, xenon, and the like are used to seal the inside of the prober 100 with these inert gases. In other words, the concentration of water and oxygen included in the atmosphere is reduced. Note that a different atmosphere may be used to seal each area in the prober 100. In this manner, by replacing the atmosphere with inert gas, and using the heating and cooling system 121 provided in the stage 120, the electrodes of the wafer 400 can be prevented from oxidation. In other words, in the storage device 1 of the present embodiment, a refresh system that raises the temperature of the wafer 400 on the stage 120 and seals the area around the wafer 400 with an inert gas may be provided in the prober 100.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A storage device comprising:
    a control apparatus configured to write data to or read data from a storage medium that includes a plurality of non-volatile memory chips; and
    a stocker configured to store a plurality of the storage media that are detached from the control apparatus, wherein
    the control apparatus includes a first temperature control system configured to raise temperature of the storage medium to a first temperature or higher, and
    the stocker includes a second temperature control system configured to cool the storage medium to a second temperature or lower, the second temperature being lower than the first temperature.

2. The storage device of claim 1, wherein the control apparatus further includes:
    a stage configured to hold the storage medium;
    a probe card including a plurality of probes on a first surface, the first surface facing the storage medium when the storage medium is held by the stage; and
    a drive unit configured to:
        move at least one of the stage or the probe card to bring a plurality of pad electrodes provided on the storage medium into contact with the plurality of probes, the plurality of pad electrodes being provided on a surface of the storage medium that faces the probe card when the storage medium is held by the stage; or
        separate the plurality of pad electrodes and the plurality of probes that are in contact with each other, wherein
    the drive unit is configured to bring the plurality of pad electrodes of the storage medium into contact with the plurality of probes after the first temperature control system raises the temperature of the storage medium to the first temperature or higher on the stage.

3. The storage device of claim 2, wherein the first temperature control system includes a plurality of temperature control systems formed in the stage, each of the plurality of temperature control systems being configured to perform temperature control for each of a plurality of areas of the storage medium held by the stage.

4. The storage device of claim 3, wherein the first temperature control system is configured to maintain temperature of each of the plurality of areas of the storage medium within a first range using the plurality of temperature control systems.

5. The storage device of claim 4, wherein the plurality of areas are areas corresponding to respective positions of the plurality of non-volatile memory chips in the storage medium.

6. The storage device of claim 2, wherein the first temperature control system includes a temperature control system configured to control temperature of the first surface of the probe card.

7. The storage device of claim 2, wherein the probe card further includes a plurality of semiconductor components on a second surface opposing to the first surface, and
the first temperature control system includes a temperature control system configured to cool the plurality of semiconductor components on the second surface.

8. The storage device of claim 7 wherein the probe card further includes heat insulating material between the first surface and the second surface.

9. The storage device of claim 7, wherein the plurality of semiconductor components include at least one of (A) at least one controller configured to control the non-volatile memory chips, (B) an interface switch configured to selectively operate a plurality of the controllers, (C) a relay, and (D) a capacitor.

10. The storage device of claim 7, wherein at least one of the plurality of semiconductor components is configured to monitor at least one of temperature measured by a thermometer provided in the stage and temperature measured by a thermometer provided in the probe card.

11. The storage device of claim 1, wherein the second temperature control system includes a cooling system configured to use cooling water, cooling air or liquid nitrogen as refrigerant.

12. The storage device of claim 1, wherein the second temperature control system includes an electronic cooling system configured to use a Peltier element provided in a first portion configured to hold the storage medium, or in a second portion connected to the first portion.

13. The storage device of claim 2, wherein the control apparatus further includes a refresh system configured to seal around the storage medium with a noble gas or an inert gas, and to raise the temperature of the storage medium on the stage using the first temperature control system.

14. The storage device of claim 13, wherein the noble gas or the inert gas is one of nitrogen, argon, helium, krypton, or xenon.

15. The storage device of claim 2, wherein the control apparatus is further configured to, when replacing the storage medium in contact with the plurality of probes from a first storage medium to a second storage medium stored in the stocker, cool the first storage medium maintained to the first temperature or higher, to lower than the first temperature on the stage using the first temperature control system.

16. The storage device of claim 2, wherein the control apparatus is further configured to, when replacing the storage medium in contact with the plurality of probes from a third storage medium to a fourth storage medium stored in the stocker, raise temperature of the fourth storage medium cooled to the second temperature or lower, to the first temperature or higher on the stage using the first temperature control system, and bring the plurality of pad electrodes of the fourth storage medium into contact with the plurality of probes using the drive unit.

17. The storage device of claim 1, further comprising a conveyance system configured to convey the storage medium from the control apparatus to the stocker or convey the storage medium from the stocker to the control apparatus, wherein
the first temperature is room temperature, and
the conveyance system includes a third temperature control system configured to adjust air in the conveyance system for a purpose of preventing condensation during conveyance of the storage medium cooled to the second temperature or lower from the stocker to the control apparatus.

18. The storage device of claim 1, wherein the storage medium is a semiconductor wafer.

19. A control method of a storage device, the storage device including a control apparatus and a stocker, said method comprising:
raising temperature of a storage medium that includes a plurality of non-volatile memory chips to a first temperature or higher, in the control apparatus that is configured to write data to or read data from the storage medium loaded on a stage;
cooling a plurality of the storage media to a second temperature or lower, while the stocker stores the plurality of the storage media detached from the control apparatus, the second temperature being lower than the first temperature; and
when replacing the storage medium connected to a probe card of the control apparatus from a first storage medium to a second storage medium stored in the stocker,
cooling the first storage medium maintained to the first temperature or higher, to lower than the first temperature in the control apparatus;
raising temperature of the second storage medium cooled to the second temperature or lower, to the first temperature or higher in the control apparatus; and
loading the second storage medium on the stage.

20. The control method of claim 19, wherein the storage medium is a semiconductor wafer.

* * * * *